United States Patent [19]

Hey

[11] Patent Number: 5,369,363

[45] Date of Patent: Nov. 29, 1994

[54] IMPLEMENT FOR REMOVING AND INSTALLING AND TESTING CHRISTMAS LIGHT BULBS

[76] Inventor: Bill L. Hey, 622 Rockford Rd., Box 14, Willshire, Ohio 45898

[21] Appl. No.: 902,730

[22] Filed: Jun. 23, 1992

[51] Int. Cl.⁵ .................. G01R 31/24; G01R 31/02
[52] U.S. Cl. ................................ 324/414; 324/133; 324/537
[58] Field of Search ............ 324/403, 414, 133, 158 F, 324/506, 507, 555, 556, 550; 340/641

[56] References Cited

U.S. PATENT DOCUMENTS

| | | | |
|---|---|---|---|
| 2,746,011 | 5/1956 | Carson | 324/414 |
| 2,965,229 | 12/1960 | Snyder et al. | 324/414 X |
| 3,725,780 | 4/1975 | Olin | 324/414 |
| 4,012,097 | 3/1977 | Long et al. | 324/158 F X |
| 4,525,664 | 6/1985 | Trammell, Jr. | 324/133 X |
| 5,008,626 | 4/1991 | Boyd, Sr. | 324/414 |
| 5,179,339 | 1/1993 | Volk, Jr. | 324/414 |

Primary Examiner—Gerard R. Strecker
Assistant Examiner—Warren S. Edmonds
Attorney, Agent, or Firm—Lundy & Associates

[57] ABSTRACT

An implement for removing from its socket and testing a Christmas light bulb which has a handle with two opposite ends. The handle has a cap secured to one of the ends. The cap has a socket in its distal end and the socket is adapted to loosely receive the base of a bulb. A cavity is formed in the other of the ends. The cavity has a top and a pair of opposite side walls that extend toward the other end, and a bottom. A bulb gripper is provided in the bottom for gripping the base of a bulb. A battery is housed in the handle. The battery is easily accessible so that it can be removed and replaced as desired. The battery and the cap are electrically connected. The handle cooperatively attaches the cap and the cavity and the gripper so that the bulb can be positioned in the cavity and the gripper can grip the base to the bulb from its socket without separating the bulb from its base. The bulb then can be loosely positioned in the socket and tested.

20 Claims, 1 Drawing Sheet

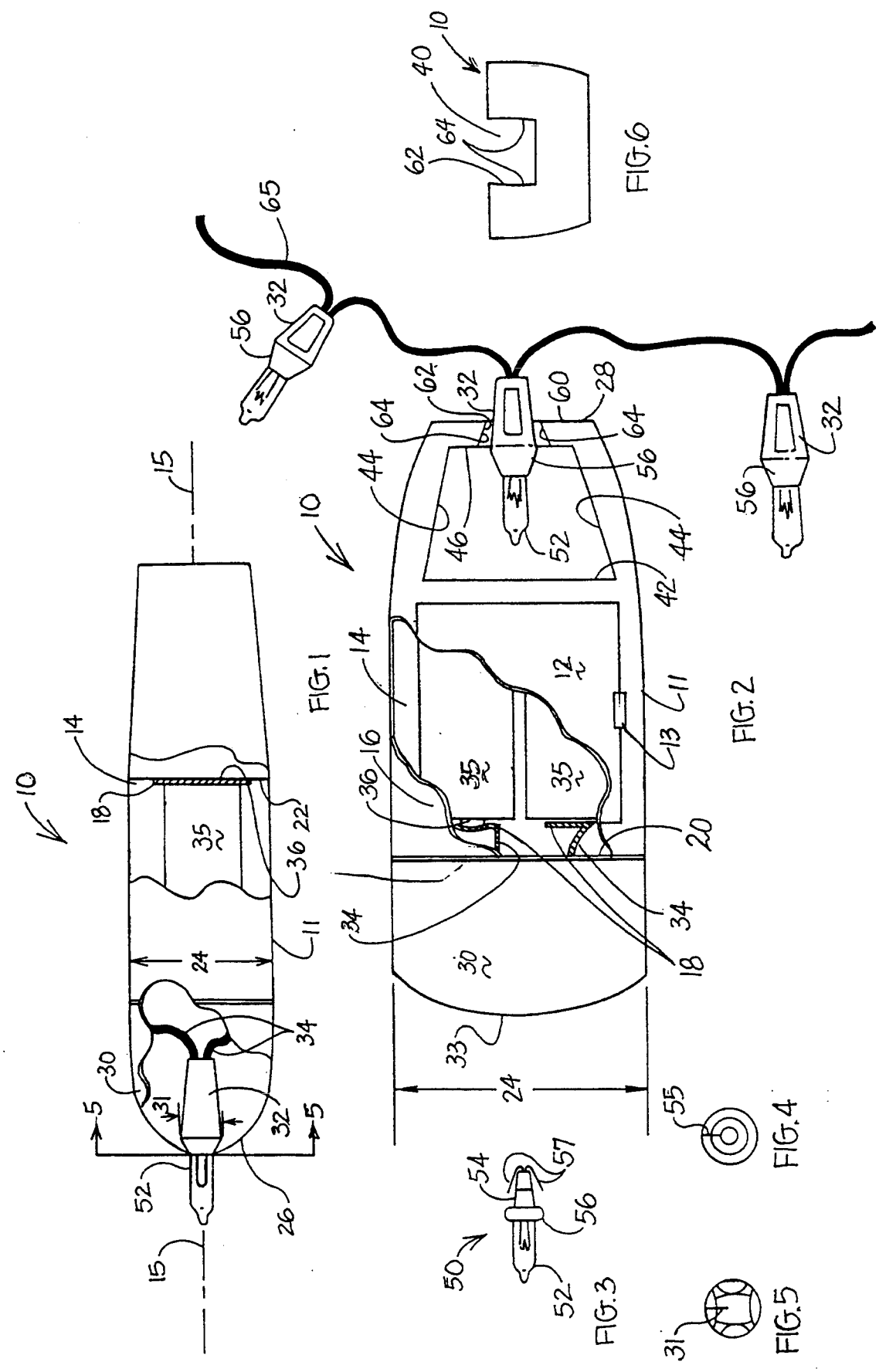

IMPLEMENT FOR REMOVING AND INSTALLING AND TESTING CHRISTMAS LIGHT BULBS

BACKGROUND OF THE INVENTION

The present invention pertains to implements for testing light bulbs and more particularly pertains to an implement that is particularly useful for removing from their sockets and testing Christmas light bulbs.

Christmas lights are notorious, because of their limited seasonal use, for becoming defective between seasons. Christmas lights come in all sizes and are removably secured in sockets which are equally spaced on leads—more commonly known as a "string" of lights. The string generally has a plug at one end adapted to plug into a power source or into the opposite end of another string, whereby the string can be made longer.

There are generally two kinds of "strings". One is strung parallel wherein each bulb is lit independently. The other is strung in series wherein all of the bulbs do not light when one or more of the bulbs or sockets are defective.

In both cases in order to test bulbs to determine whether they are defective the lead must be plugged into a power source. Those bulbs in parallel strings which do not light are defective. In series strings each bulb and/or socket must be tested in order to determine which ones are defective. It is often the case that the socket not the bulb is defective. In any case many bulbs which are not defective, are thrown away.

Another problem is convenience. In order to "trouble shoot" a string of lights, the operator must be positioned near a source of electricity. This is especially inconvenient as many Christmas lights are positioned outdoors where electricity outlets are scarce, and in some instances non-existent. Testing methods heretofore available are also complicated by new bulb designs.

Some bulbs are extremely tiny and difficult to hold without damaging the fragile connections, or pulling the glass portion loose from the base. The dexterity required to remove these bulbs from their sockets is imperial; this is especially true if the operator has arthritis or if the work is being done outdoors in characteristically cold Christmas-time temperatures. Lastly, one becomes frustrated after spending time struggling to remove a bulb from its socket, only to discover that be has positioned the bulb in a defective socket, or he has damaged the bulb rendering it defective.

Therefore it is highly desirable to provide an improved implement for removing and installing Christmas light bulbs.

It is also highly desirable to provide an improved implement for testing Christmas light bulbs.

It is also highly desirable to provide an improved implement for removing, installing and testing Christmas light bulbs.

It is also highly desirable to provide an improved implement for removing, installing and testing Christmas light bulbs which conveniently carries its own power source.

It is also highly desirable to provide an improved implement for removing, installing and testing "miniature" Christmas light bulbs that is capable of removing the bulb from its socket without damaging the fragile leads or pulling the bulb loose from its base.

It is also highly desirable to provide an improved implement for removing, installing and testing Christmas light bulbs that is capable of removing and testing a Christmas light quickly and conveniently.

It is finally highly desirable to provide an improved implement for removing, installing and testing Christmas light bulbs which meets all of the above desired features.

SUMMARY OF THE INVENTION

Therefore it is an object of the invention to provide an improved implement for removing and installing Christmas light bulbs.

It is also an object of the invention to provide an improved implement for testing Christmas light bulbs.

It is also an object of the invention to provide an improved implement for removing, installing and testing Christmas light bulbs.

It is also an object of the invention to provide an improved implement for removing, installing and testing Christmas light bulbs which conveniently carries its own power source.

It is also an object of the invention to provide an improved implement for removing, installing and testing "miniature" Christmas light bulbs that is capable of removing the bulb from its socket without damaging the fragile leads or pulling the bulb loose from its base.

It is also an object of the invention to provide an improved implement for removing, installing and testing Christmas light bulbs that is capable of removing and testing a Christmas light quickly and conveniently.

It is finally an object of the invention to provide an improved implement for removing, installing and testing Christmas light bulbs which meets all of the above desired features.

In the broader aspects of the invention there is provided an implement for removing from its socket and testing a Christmas light bulb which has a handle with two opposite ends. The handle has a cap secured to one of the ends. The cap has a socket in its distal end and the socket is adapted to loosely receive the base of a bulb. A cavity is formed in the other of the ends. The cavity has a top and a pair of opposite side walls that extend toward the other end, and a bottom. A bulb gripper is provided in the bottom for gripping the base of a bulb. A battery is housed in the handle. The battery is easily accessible so that it can be removed and replaced as desired. The battery and the cap are electrically connected. The handle cooperatively attaches the cap and the cavity and the gripper so that the bulb can be positioned in the cavity and the gripper can grip the base to the bulb from its socket without separating the bulb from its base. The bulb then can be loosely positioned in the socket and tested.

BRIEF DESCRIPTION OF THE DRAWINGS

The above-mentioned and other features and objects of the invention and the manner of attaining them will become more apparent and the invention itself will be better understood by reference to the following description of an embodiment of the invention taken in conjunction with the accompanying drawings wherein:

FIG. 1 is a side cut-away view of the handled implement showing the socket and battery housing of the invention.

FIG. 2 is a top cut-away view of the handled implement of the invention showing the battery and the bulb gripper of the invention.

FIG. 3 is a side planar view of a Christmas light bulb.

FIG. 4 is an end planar view of the Christmas light bulb shown in FIG. 3 taken essentially along line 4—4.

FIG. 5 is an end planar view of the implement of the invention taken essentially along line 5—5.

FIG. 6 is a planar view of the opposite end of the implement of the invention and the bulb gripper of the invention.

DESCRIPTION OF A SPECIFIC EMBODIMENT

The implement 10 of the invention has handle 11 with an interior 14. One embodiment of handle 11 is formed of plastic, however, handle 11 can be formed of any sturdy material, such as metal, wood, or the like. Handle 11 has a width 24 and thickness 26 of suitable size so that handle 11 can de comfortably held by a human hand.

Implement 10 of the invention has cap 30 secured to one end 26 of handle 11. Cap 30 is, in one embodiment, removably secured to end 26 of handle 11 while another embodiment has cap 30 permanently secured to end 26 of handle 11. Cap 30 has a socket 32 secured in its distal end 33. Socket 32 has socket radius 31 slightly larger than base radius 55 of bulb 50 so that socket 32 may loosely receive base 54 of bulb 50 with leads 51 positioned to make contact with bulb leads 57, but otherwise is identical to the sockets on the string with which the bulb is used. Bulb 50 has a bulb or glass portion 52, and a base 54 with base radius 55, and a collar 56, as shown in FIG. 3.

Interior 14 of handle 11 has power source housing 16 with housing top 20 and housing bottom 22. A pair of conducting plates 18 are secured to housing top 20 and housing bottom 22, respectively, as is conventional. Power source 35 is electrically connected to socket cap 30 with wires 34. Power source 35 can be solar energy storage cells, similar to those utilized in pocket calculators and the like, or can be comprised of other power sources known throughout the industry. However, one embodiment utilizes batteries because of the requirement of portability and that handle 11 be conveniently held by a human hand and thus handle width 24 easily accommodates a battery. One embodiment of handle 11 has at least one battery 35 positioned in battery housing 16 with terminal ends 36 of battery 35 being contiguous with conducting plates 18. Another embodiment of handle 11 utilizes a pair of type AA batteries 35 positioned in battery housing 16 with terminal ends 36 being contiguous with respective conducting plates 18, as shown in FIG. 2. Leads 51 of socket 32 and battery 35 are electrically connected by wires 34. In the embodiment utilizing a pair of type AA batteries 35, batteries 35 are connected in series. A door 12 with lock 13 is provided making battery 35 easily accessible.

In one embodiment, handle 11 is cooperatively provided with a cavity 40 formed in its opposite end 28. Cavity 40 has cavity top 42, cavity side walls 44, cavity bottom 46, and wall opening 48. Cavity side walls 44 and wall opening 48 extend between top 42 and bulb gripper 60 and converge toward bottom 46 and end 28 of handle 11. Bulb gripper 60 is formed in bottom 46 for gripping base 54 of bulb 50. One embodiment of handle 11 has cavity top 42, side walls 44 and bottom 46 composed of the same material as handle 11. Bulb gripper 60 is also composed of the same material as handle 11. A preferred embodiment utilizes plastic for forming handle 11 and cavity 40. It is not imperative, however, that bulb gripper 60 be formed from the same material as handle 11 so long as bulb gripper 60 is made of stiff and resilient material to yield sufficiently to allow collar 56 to be positioned in gripper 60 and to prevent collar 56 from unintentionally slipping from the grasp of bulb gripper 60 once so positioned. Bulb gripper 60 has a cut-out 62 in cavity bottom 56. Cut-out 62 has a pair of oppositely tapered walls 64 joining cavity bottom 46 as shown in FIG. 2. Cut-out 62 is between about one-quarter and three-quarters the depth of cavity 40.

Cavity 40, in one embodiment, is large enough so that spare bulbs 50 can be stored therein, while another embodiment has cavity 40 sufficient in size only to provide for glass portion 52 and collar 56 of bulb 50. Cavity 40 can be larger than required and may be altered in its shape as desired. Cavity 40, in all embodiments must be at least large enough to allow glass portion 52 and collar 56 to be adequately housed while bulb gripper 60 is in operation.

In the embodiment illustrated, handle 11 cooperatively attaches cap 30, cavity 40, and bulb gripper 60 as a single unit. With this embodiment, bulb 50 can be removed from socket 32 and tested all utilizing the same implement 10.

In operation, implement 10 can remove Christmas light bulbs 50 from sockets 32 and test bulbs 50 to determine whether they are defective. Leads 65 and socket 32 must De grasped. Handle 11 with bulb gripper 60 extending outwardly therefrom is held with the opposite hand. Bulb 50 is positioned into bulb gripper 60 with glass portion 52 and collar 56 extending into cavity 40 while socket 32 generally remains external to implement 10. The positioning of bulb 50 into cavity 40 is accomplished by inserting bulb 50 into cavity 40 from the side of handle 11 through wall opening 48. In other words, bulb 50 is made to approach cavity 40 transaxially of axis 15. Socket 32 is then grasped firmly with one hand and handle 11 is grasped firmly with the other and implement 10 and socket 32 are separated in opposite directions along axis 15. Tapered walls 64 resiliently grasp collar 56 and do not permit collar 56 of bulb 50 to pass therethrough, thus bulb 50 remains in cavity 40 while socket 32 remains on lead 65.

Finger and thumb dexterity is not a skill which is necessary in utilizing implement 10. Bulb gripper 60 provides the gripping action while handle 11 allows the operator to comfortably remove bulb 50 from socket 32. Additionally, all of Christmas light bulbs 50 and leads 65 can be tested indoors where it is warm and comfortable and with or without a source of electricity, adding to the freedom of the operator to perform testing where and when it is desirous. Further, implement 10 is capable of removing the bulb 50 without damaging the fragile bulb leads 57, their connections, or pulling the glass portion 52 loose from base 54 of bulb 50.

Once bulb 50 is in cavity 40, handle 11 can be flipped over to remove bulb 50 therefrom and bulb 50 may be tested to determine whether it is defective. Socket 32 and cap 30 has socket radius 31 slightly larger than base radius 55 so that base 54 of bulb 50 can be loosely received by socket 32 in distal end 33. As the two ends of implement 10 have totally different shapes one can orient implement 10 and successfully use implement 10 without looking. The interior of socket 32 has sufficient conductive surface area to contact bulb leads 57 so that bulb 50 will glow if bulb 50 is free from defects. Once it is determined that bulb 50 is or is not free of defects, bulb 50 can be replaced in socket 32 on lead 65 or thrown away as desired. If desired, bulb gripper 60 can be used to replace bulb 50 in its socket 32 after it has tested "good" by reversing the procedure above described. Implement 10 is slightly larger than the handle of a common screwdriver, and thus is conveniently handled and can be stored in a utility drawer or tool box as desired.

The implement 10 of the invention can be used indoors or outdoors, and because it carries its own power source, Christmas light bulbs do not need to be tested near a source of electricity. Implement 10 allows its operator to test Christmas light bulbs without the use of potentially defective sockets thus ensuring a greater recovery rate of bulbs that are not defective. Bulb gripper 60 is capable of removing bulb 50 without damaging fragile connections or pulling glass portion 52 loose from base 54 of bulb 50. Lastly, implement 10 is capable of removing and testing and installing Christmas light bulbs 50 from a string of lights quickly and conveniently.

While a specific embodiment of the invention has been shown and described herein for purposes of illustration, the protection afforded by any patent upon this application is not strictly limited to the disclosed embodiment; but rather extends to all structures and arrangements which fall fairly within the scope of the claims which are appended hereto:

What is claimed is:

1. An implement for removing a Christmas light bulb from an appliance comprising a handle, said handle defining an axis, a cavity formed in said handle at one end, said cavity having a top, side walls extending toward said end and a bottom, said cavity having a bulb gripper formed in said bottom for gripping the base of a bulb and a side opening defined by said top and sides and bottom through which the glass portion of a bulb can be positioned in said cavity when said bulb is gripped by said bulb gripper whereby a bulb can be disjoined from said appliance without damaging the bulb.

2. The implement of claim 1 wherein said gripper is a cut-out in said bottom and said one end, said cut-out having a pair of opposite tapered walls, said tapered walls extending between said cavity and said one end, whereby said cut-out provides access to said cavity from said one end, said cut-out being between about one-quarter and three-quarters the depth of said cavity.

3. The implement of claim 1 wherein said tapered walls are spatially disposed, whereby said bulb can be positioned in said cut-out with said glass portion within said cavity and said base extending outwardly from said one end, said bulb having a collar, said collar being unable to pass through said cut-out, said tapered walls resiliently gripping said collar whereby said bulb remains in said cavity when said appliance and said base are separated.

4. The implement of claim 1 further comprising a socket at the other end of said handle ends, said socket being adapted to loosely receive the base of said bulb, at least one battery being positioned within said handle, said battery and said socket being electrically connected, whereby said bulb can be tested by loosely positioning said base of said bulb in said socket and illuminating said bulb when said bulb is free of defects, whereby said socket and said gripper cooperate as a single unit to remove and test and replace Christmas light bulbs.

5. The implement of claim 4 wherein said socket has a radius of about 0.187 inches to about 0.25 inches and a depth of about 0.5 inches, and said base has a radius of about 0.125 inches, whereby said socket loosely receives said base.

6. The implement of claim 4 wherein said handle has a door with a latch and a handle interior, said interior defining a battery housing having a top and a bottom, a pair of conducting plates secured to said top and said bottom respectively, said battery being positioned in said housing with the terminal ends of said battery being contiguous with said conducting plates respectively, a pair of wires connecting said socket and said conducting plates.

7. The implement of claim 6 wherein said battery is a pair of AA type batteries.

8. The implement of claim 4 wherein said handle defines a battery housing therein having a top and a bottom, a pair of conducting plates secured to said top and said bottom, respectively, said battery being positioned in said housing with the terminal ends of said battery being contiguous with said conducting plates, respectively, a pair of wires electrically connecting said socket and said conducting plates.

9. The implement of claim 8 wherein said handle has a door with a latch providing access to said battery housing, whereby said battery can be removed and replaced.

10. An implement for removing from its socket and testing a Christmas light bulb comprising a handle having opposite ends, said handle having a socket in one of said ends, a cavity adjacent the other of said ends, a bulb gripper between said cavity and said other end, a battery positioned within said handle, said battery and said socket being electrically connected, said handle cooperatively attaching said socket and said gripper, whereby a bulb can be positioned in said cavity and said gripper can grip the bulb to disjoin the bulb from its socket without separating the glass portion of the bulb from the bulb base and the bulb can be loosely positioned in said socket to illuminate the bulb when the bulb is free of defects.

11. The implement of claim 10 wherein said handle is from about 3 to about 5 inches long, from about 1 to about 2 inches wide, and from about 0.5 inches to about 1 inch thick, whereby said base of said bulb can be tested by loosely positioning said bulb base in said socket and illuminating said bulb when said bulb is free of defects.

12. The implement of claim 10 wherein said handle defines a battery housing therein having a top and a bottom, a pair of conducting plates secured to said top and said bottom, respectively, said battery being positioned in said housing with the terminal ends of said battery being contiguous with said conducting plates, respectively, a pair of wires electrically connecting said socket and said conducting plates.

13. The implement of claim 10 wherein said socket has a radius of about 0.187 inches to about 0.25 inches and a depth of about 0.5 inches, and said base has a radius of about 0.125 inches, whereby said socket loosely receives said base.

14. The implement of claim 10 wherein said handle has a door with a latch providing access to said battery housing, whereby said battery can be removed and replaced.

15. The implement of claim 14 wherein said battery is a pair of AA type batteries.

16. The implement of claim 10 wherein said gripper is a cut-out in said other end, said cut-out having a pair of opposite tapered walls, said tapered walls joining said other end and said cavity, said cut-out being between about one-quarter to three-quarters the depth of said cavity.

17. The implement of claim 16 wherein said tapered walls are resiliently deformable and spatially disposed, whereby said bulb can be positioned in said cut-out with said glass portion being in said cavity and its base extending outwardly from said end and its collar being unable to pass through said cut-out.

18. The implement of claim 10 wherein said socket has a radius of about 0.187 inches to about 0.25 inches and a depth of about 0.5 inches, said base has a radius of about 0.125 inches, whereby said socket loosely receives said base.

19. The implement of claim 10 wherein said handle has a door with a lock, and an interior defining a battery housing having a top and a bottom, a pair of conducting plates secured to said top and said bottom respectively, said battery being positioned in said housing with the terminal ends of said battery being contiguous with said conducting plates respectively, a pair of wires connecting said cap and said top conducting plate.

20. The implement of claim 10 wherein said battery is a pair of AA type batteries.

* * * * *